(12) United States Patent
Little et al.

(10) Patent No.: US 9,472,911 B2
(45) Date of Patent: Oct. 18, 2016

(54) FLIPPABLE ELECTRICAL CONNECTOR WITH CONCENTRIC INNER AND OUTER MATING PORTS

(71) Applicant: FOXCONN INTERCONNECT TECHNOLOGY LIMITED, Grand Cayman (KY)

(72) Inventors: Terrance F. Little, Fullerton, CA (US); Stephen Sedio, Valley Center, CA (US); Mick Mulcuck, Austin, TX (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 14/645,155

(22) Filed: Mar. 11, 2015

(65) Prior Publication Data
US 2015/0207279 A1 Jul. 23, 2015

Related U.S. Application Data

(63) Continuation-in-part of application No. 14/558,732, filed on Dec. 3, 2014, and a continuation-in-part of application No. 14/542,550, filed on Nov. 15, 2014, now Pat. No. 9,350,126, and a continuation-in-part of (Continued)

(51) Int. Cl.
*H01R 24/00* (2011.01)
*H01R 24/60* (2011.01)
(Continued)

(52) U.S. Cl.
CPC ............. *H01R 24/60* (2013.01); *H01R 23/02* (2013.01); *H01R 25/006* (2013.01); *H01R 12/724* (2013.01); *H01R 13/6582* (2013.01); *H01R 24/28* (2013.01); *H01R 2107/00* (2013.01);
(Continued)

(58) Field of Classification Search
CPC ...... H01R 11/32; H01R 12/57; H01R 13/26; H01R 13/514; H01R 13/658; H01R 23/02; H01R 23/7073
USPC ......................................... 439/374, 626, 660
See application file for complete search history.

(56) References Cited

U.S. PATENT DOCUMENTS

| | | |
|---|---|---|
| 5,073,130 A | 12/1991 | Nakamura |
| 6,755,689 B2 | 6/2004 | Zhang et al. |

(Continued)

FOREIGN PATENT DOCUMENTS

| | | |
|---|---|---|
| CM | 201868687 U | 6/2011 |
| CN | 201029143 Y | 2/2008 |

(Continued)

OTHER PUBLICATIONS

USB Type-C Specification 0.9c05-20140518.

(Continued)

*Primary Examiner* — Chandrika Prasad
(74) *Attorney, Agent, or Firm* — Wei Te Chung; Ming Chieh Chang

(57) ABSTRACT

A plug connector is mateable with the receptacle connector wherein each of the plug connector and the receptacle connector includes an inner mating port surrounded by an outer mating port in a concentric manner. The inner mating port is equipped with two rows of contacts arranged in a diagonally symmetrical manner. The outer mating port is equipped with larger power contacts symmetrically arranged with a center of the inner mating port.

9 Claims, 23 Drawing Sheets

Related U.S. Application Data application No. 14/497,205, filed on Sep. 25, 2014, and a continuation-in-part of application No. 14/477,889, filed on Sep. 5, 2014, and a continuation-in-part of application No. 14/454,737, filed on Aug. 8, 2014, and a continuation-in-part of application No. 14/337,180, filed on Jul. 21, 2014, now Pat. No. 9,318,853, and a continuation-in-part of application No. 14/517,941, filed on Oct. 20, 2014.

(60) Provisional application No. 61/951,488, filed on Mar. 11, 2014, provisional application No. 61/969,823, filed on Mar. 24, 2014, provisional application No. 61/981,217, filed on Apr. 18, 2014, provisional application No. 61/940,815, filed on Feb. 17, 2014, provisional application No. 61/943,310, filed on Feb. 22, 2014, provisional application No. 61/949,232, filed on Mar. 6, 2014, provisional application No. 61/917,363, filed on Dec. 18, 2013, provisional application No. 61/926,270, filed on Jan. 11, 2014, provisional application No. 61/916,147, filed on Dec. 14, 2013, provisional application No. 61/919,681, filed on Dec. 20, 2013, provisional application No. 61/875,096, filed on Sep. 8, 2013, provisional application No. 61/863,896, filed on Aug. 8, 2013, provisional application No. 61/866,037, filed on Aug. 14, 2013, provisional application No. 61/867,584, filed on Aug. 19, 2013, provisional application No. 61/856,077, filed on Jul. 19, 2013, provisional application No. 61/857,687, filed on Jul. 23, 2013, provisional application No. 61/899,276, filed on Nov. 3, 2013.

(51) Int. Cl.
| | |
|---|---|
| *H01R 25/00* | (2006.01) |
| *H01R 107/00* | (2006.01) |
| *H01R 12/72* | (2011.01) |
| *H01R 13/6582* | (2011.01) |
| *H01R 24/28* | (2011.01) |
| *H05K 1/11* | (2006.01) |
| *H05K 1/18* | (2006.01) |

(52) U.S. Cl.
CPC ............ *H05K 1/117* (2013.01); *H05K 1/184* (2013.01); *H05K 2201/09063* (2013.01); *H05K 2201/10189* (2013.01)

(56) References Cited

U.S. PATENT DOCUMENTS

| | | | |
|---|---|---|---|
| 7,578,705 B2* | 8/2009 | He | H01R 13/514 439/660 |
| 7,670,191 B2* | 3/2010 | Ortega | H01R 31/005 439/660 |
| 7,758,379 B2 | 7/2010 | Chen | |
| 8,087,944 B2 | 1/2012 | Kumamoto et al. | |
| 8,419,474 B2* | 4/2013 | Zhang | G02B 6/3817 439/607.25 |
| 8,517,773 B2 | 8/2013 | Lee et al. | |
| 8,961,237 B2* | 2/2015 | Xu | H01R 13/629 439/660 |
| 8,968,031 B2 | 3/2015 | Simmel et al. | |
| 2009/0137157 A1* | 5/2009 | Swanger | H01R 13/6585 439/655 |
| 2009/0163071 A1* | 6/2009 | Chen | H01R 13/65802 439/352 |
| 2010/0267261 A1 | 10/2010 | Lin | |
| 2011/0013872 A1* | 1/2011 | Zhang | G02B 6/3817 385/93 |
| 2011/0256761 A1* | 10/2011 | Wu | H01R 12/598 439/580 |
| 2011/0256764 A1* | 10/2011 | Wu | H01R 12/598 439/607.01 |
| 2011/0294357 A1* | 12/2011 | Tanaka | H01R 13/6471 439/660 |
| 2013/0095702 A1 | 4/2013 | Golko et al. | |
| 2013/0252468 A1* | 9/2013 | Yu | H01R 13/46 439/626 |
| 2014/0024257 A1 | 1/2014 | Castillo | |
| 2014/0065869 A1* | 3/2014 | Xu | H01R 13/629 439/345 |
| 2014/0370759 A1* | 12/2014 | Tai | H01R 12/724 439/629 |
| 2015/0162684 A1 | 6/2015 | Amini et al. | |
| 2015/0171562 A1 | 6/2015 | Gao et al. | |
| 2015/0214673 A1 | 7/2015 | Gao et al. | |
| 2015/0214674 A1 | 7/2015 | Simmel et al. | |
| 2015/0295362 A1 | 10/2015 | Tzviskos et al. | |
| 2015/0340813 A1 | 11/2015 | Ng et al. | |
| 2015/0340815 A1 | 11/2015 | Gao et al. | |
| 2015/0340825 A1 | 11/2015 | Ng et al. | |
| 2015/0380851 A1* | 12/2015 | Zhao | H01R 13/5837 439/626 |

FOREIGN PATENT DOCUMENTS

| | | |
|---|---|---|
| CN | 201230066 Y | 4/2009 |
| CN | 101573840 A | 11/2009 |
| CN | 201623280 U | 11/2010 |
| CN | 201741935 U | 2/2011 |
| CN | 201741937 U | 2/2011 |
| CN | 102437482 A | 5/2012 |
| CN | 102544812 A | 7/2012 |
| CN | 202423735 U | 9/2012 |
| CN | 202737282 U | 2/2013 |
| CN | 103081253 A | 5/2013 |
| CN | 203242848 U | 10/2013 |
| CN | 203481540 U | 3/2014 |
| TW | M288035 | 2/2006 |
| TW | M357077 C | 5/2009 |
| TW | I427870 | 6/2011 |
| TW | M414692 | 10/2011 |
| TW | M443957 | 12/2012 |
| TW | M453995 | 5/2013 |
| TW | M454654 | 6/2013 |
| WO | WO2009147791 | 12/2009 |
| WO | WO2013/020359 | 2/2013 |

OTHER PUBLICATIONS

Universal Serial Bus Type-C Cable and Connector Specification Revision 1.0 Aug. 11, 2014.
Universal Serial Bus Type-C Cable and Connector Specification Revision 0.7 Working Draft Jan. xx, 2014.

* cited by examiner

FLIPPABLE ELECTRICAL CONNECTOR WITH CONCENTRIC INNER AND OUTER MATING PORTS

CROSS REFERENCE TO RELATED APPLICATIONS

This application is a continuation-in-part of the co-pending application Ser. No. 14/497,205 filed Sep. 25, 2014 and Ser. No. 14/558,732 filed Dec. 3, 2014 and the instant application further claims the benefit of, and priority to, U.S. Provisional Patent Application No. 61/951,488, filed Mar. 11, 2014, No. 61/969,823, filed Mar. 24, 2014, and No. 61/981,217, filed Apr. 18, 2014 the contents of which are incorporated entirely herein by reference.

BACKGROUND OF THE INVENTION

1. Field of the Invention

The present invention relates to an electrical connector, and more particularly to a flippable plug connector used with a receptacle connector.

2. Description of Related Art

In the previously filed provisional applications, the plug connector is "flappable" which can be inserted into the corresponding receptacle connector in dual orientations with the same function. In order to be able to handle switching of the super speed signaling, a MUX (or SS switch) is built into the silicon. This can be costly and also cause some additional degradation in the super speed signals. Recently, a proposal for use with the future USB (Universal Serial Bus) was presented to disclose the plug connector equipped with the metallic internal spring plates to contact the metallic collar around a root area of the mating tongue of the receptacle connector. Anyhow, under some situations, an additional larger power is desired to be provided for electrical transmission.

Hence, a new and simple electrical plug connector and the complementary receptacle connector are desired to not only provide the additional larger power but also be compatible with the standard type connector disclosed in the aforementioned proposal.

SUMMARY OF THE INVENTION

Accordingly, the object of the present invention is to provide a flippable plug connector and a complementary receptacle connector wherein the plug connector forms an inner mating port and an outer mating port circumferentially surrounding the inner mating port. The inner mating port defines a capsular front contour and includes an insulative inner housing defining a rectangular receiving cavity therein and enclosed in the metallic shell. Upper and lower rows of contacts are disposed in the housing with corresponding contacting sections extending into two opposite upper and lower sides of the receiving cavity wherein the upper and lower rows of contacts are diagonally symmetrically arranged with each other in both electrical and mechanical arrangements so as to meet the so-called flappable mating, i.e., the dual orientations.

Corresponding to the plug connector, the corresponding receptacle connector includes an inner mating portion surrounded by an outer mating portion. The inner mating portion includes an insulative housing enclosed with a metallic shield with a forwardly extending mating tongue with a capsular mating cavity formed by the shield. Opposite upper and lower rows of contacts are disposed in the housing with corresponding contacting sections exposed upon two opposite surfaces of the mating tongue wherein the upper and lower rows of contacts are diagonally symmetrically arranged with each other for both electrical and mechanical arrangements so as to perform the so-called flappable mating with the corresponding plug connector.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Figure 1:
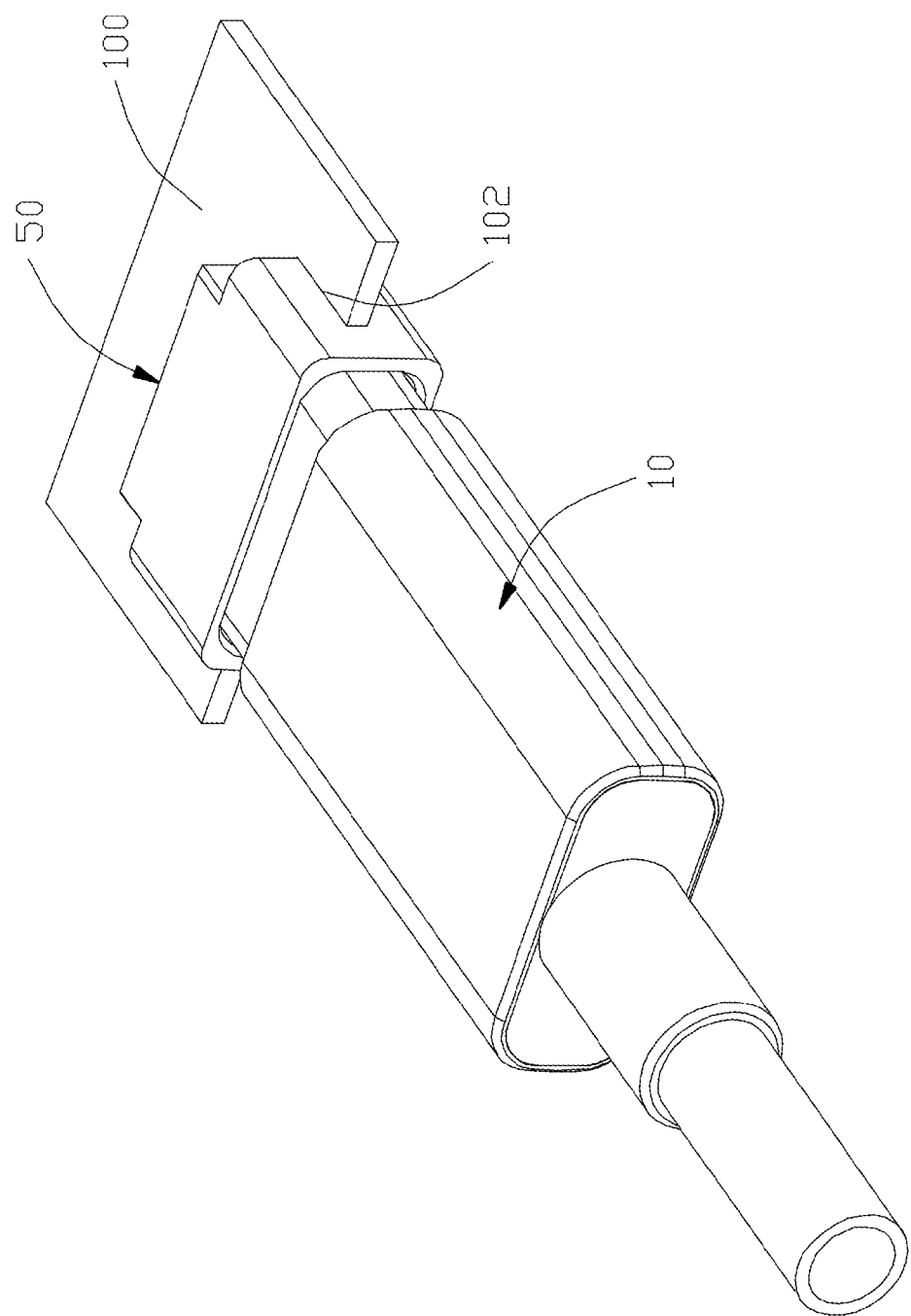
FIG. 1 is an assembled perspective view of a mated receptacle connector on the printed circuit board and the plug connector of the instant invention.
Figure 2A:
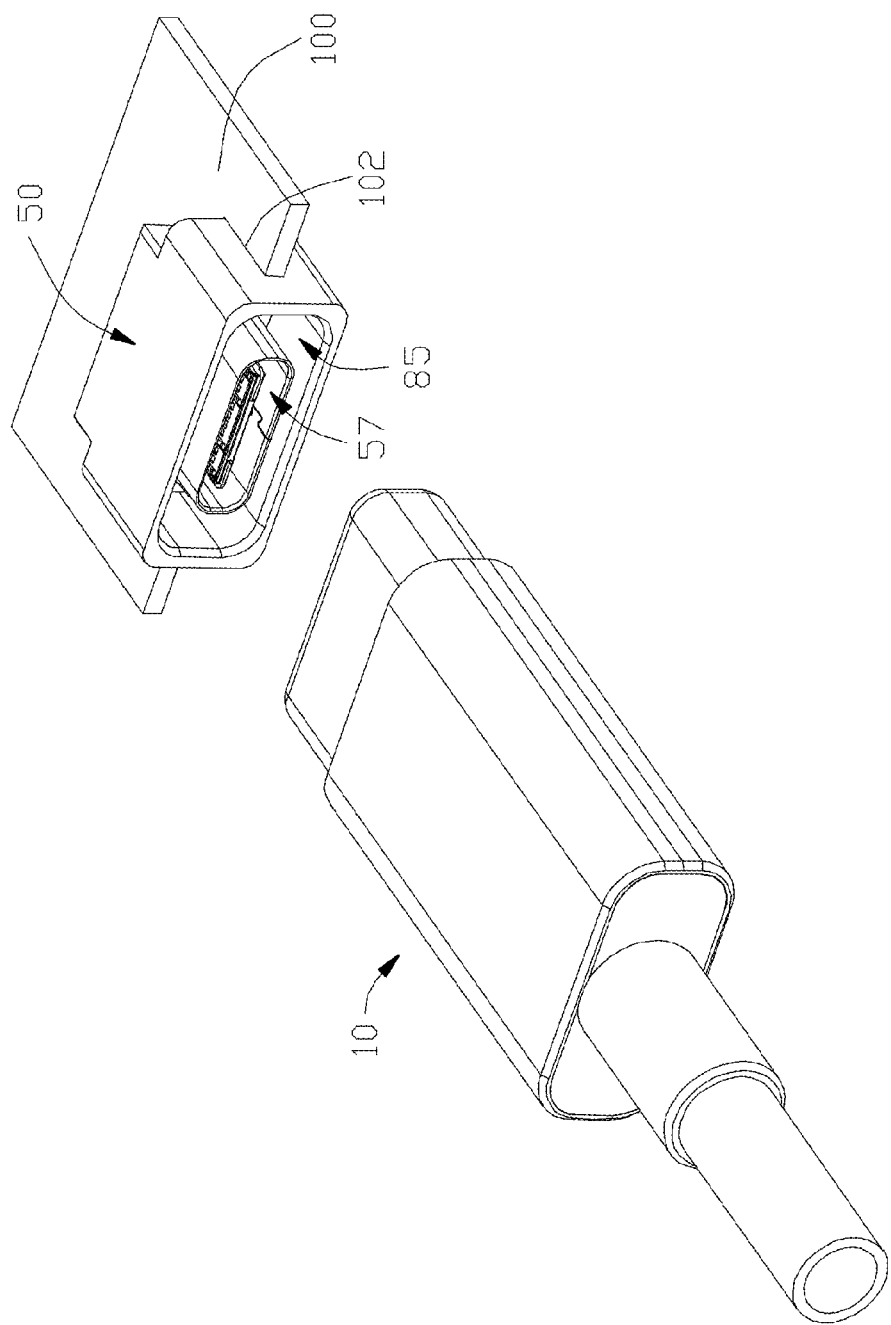
FIG. 2(A) is a front exploded perspective view of the receptacle connector and the plug connector of FIG. 1.
Figure 2B:
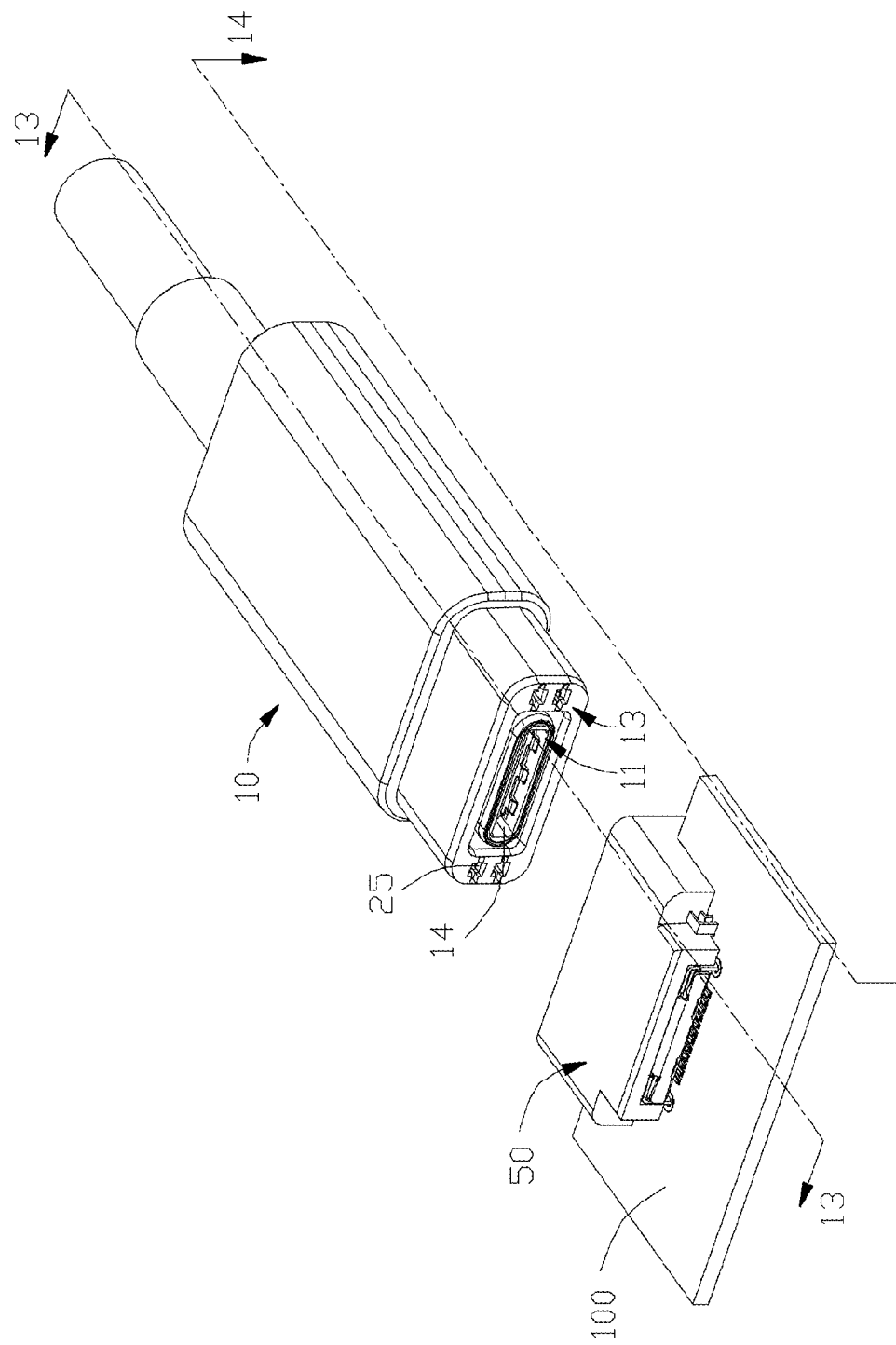
FIG. 2(B) is an opposite exploded perspective view of the receptacle connector and the plug connector of FIG. 1.
Figure 3:
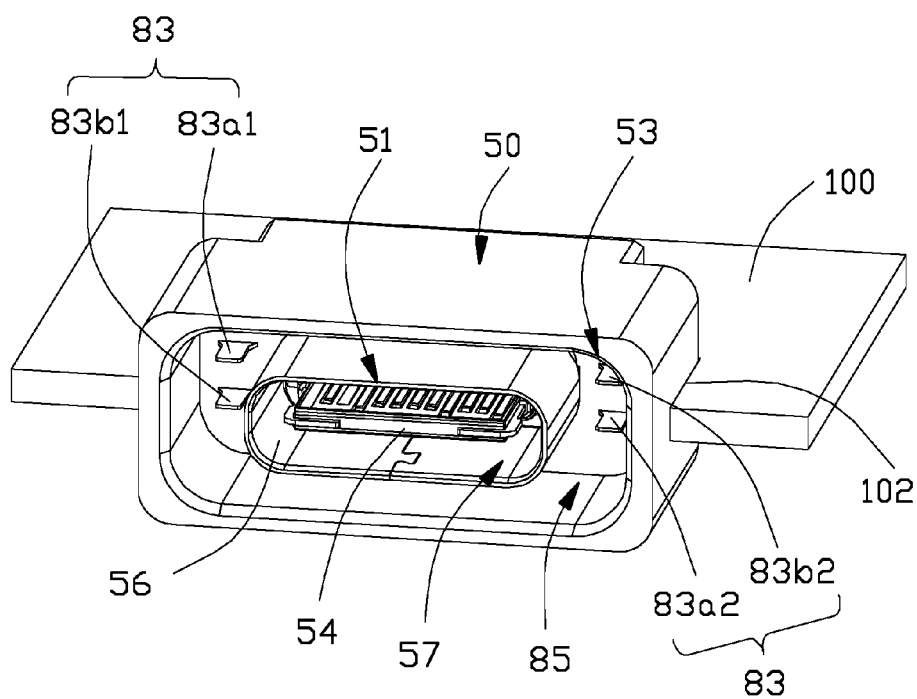
FIG. 3 is a front perspective view of the receptacle connector on the printed circuit board of FIG. 1.
Figure 4:
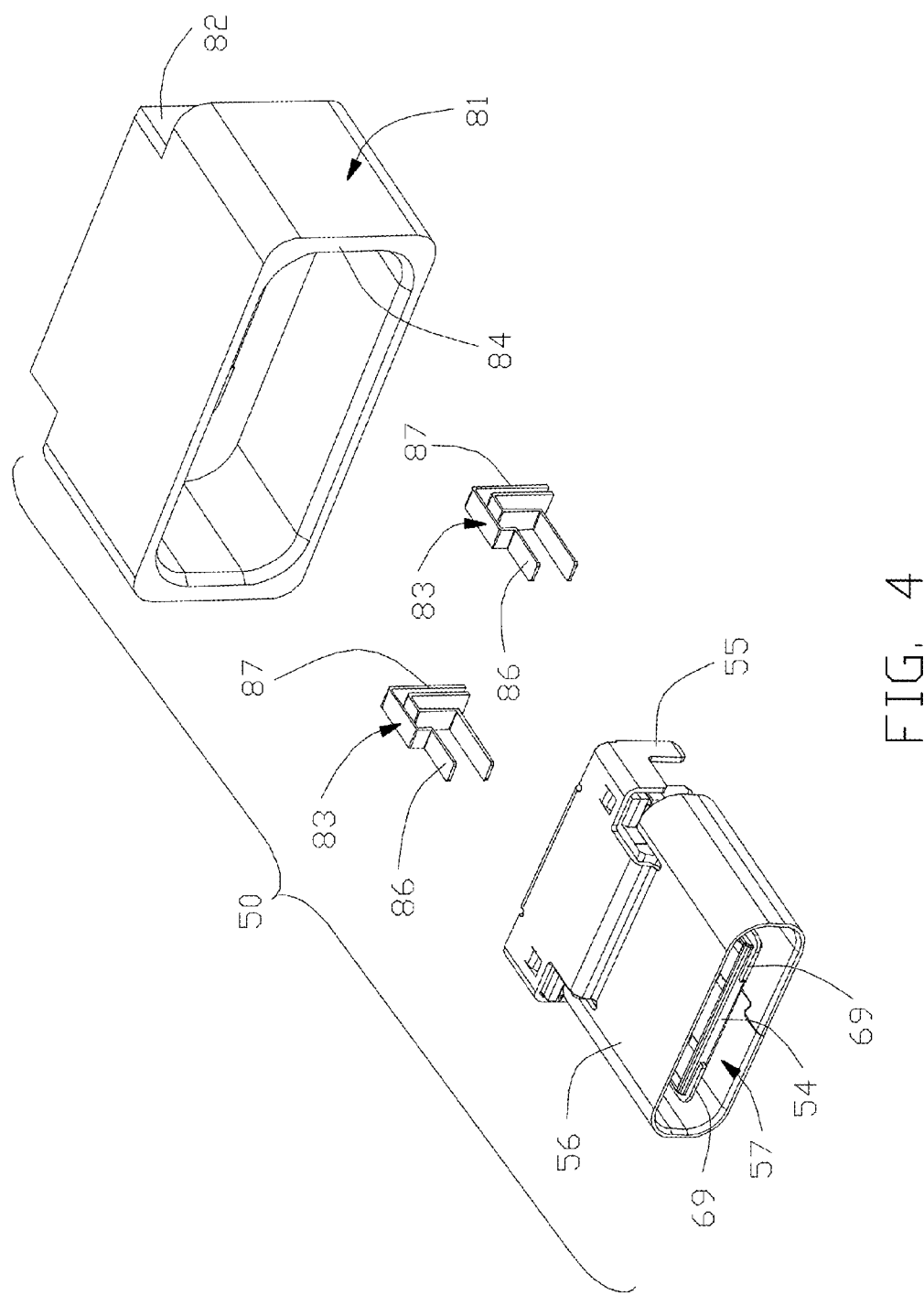
FIG. 4 is a front perspective view of the receptacle connector of FIG. 1 wherein the outer housing and the larger power contacts are removed away from the remainders.
Figure 5:
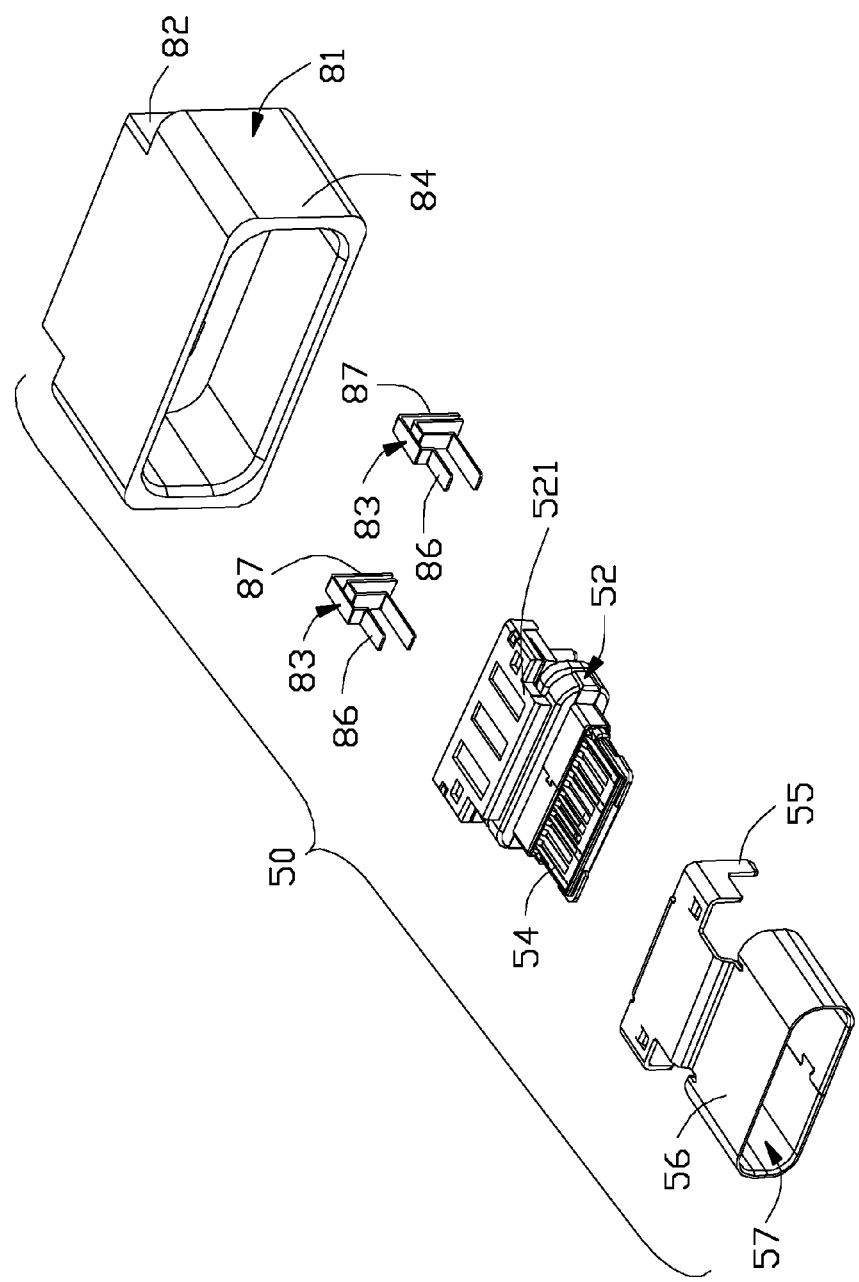
FIG. 5 is a front partially exploded perspective view of the receptacle connector of FIG. 4 wherein the shield is removed from the inner housing.
Figure 6:
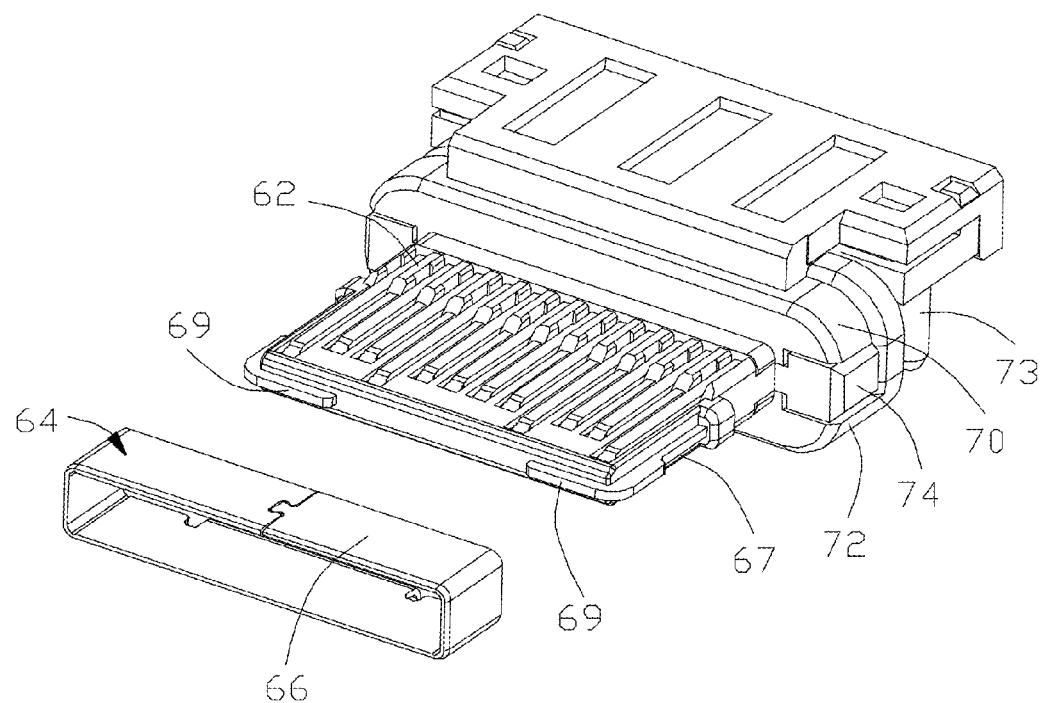
FIG. 6 is a front partially exploded perspective view of the receptacle connector of FIG. 5 wherein the collar is removed from the inner housing.
Figure 7A:
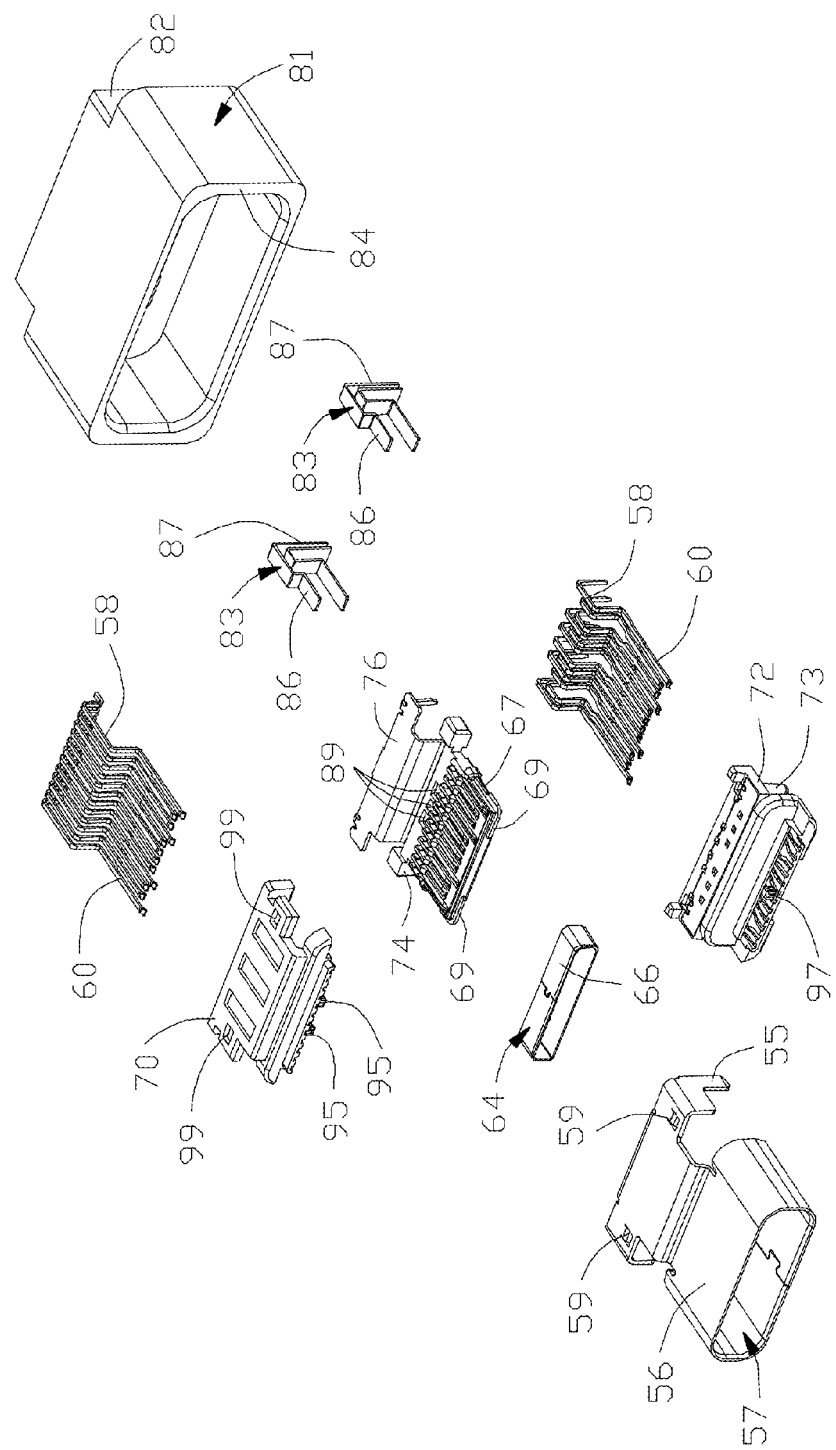
FIG. 7(A) is a front partially exploded perspective view of the receptacle connector of FIG. 1 to show the parts thereof.
Figure 7B:
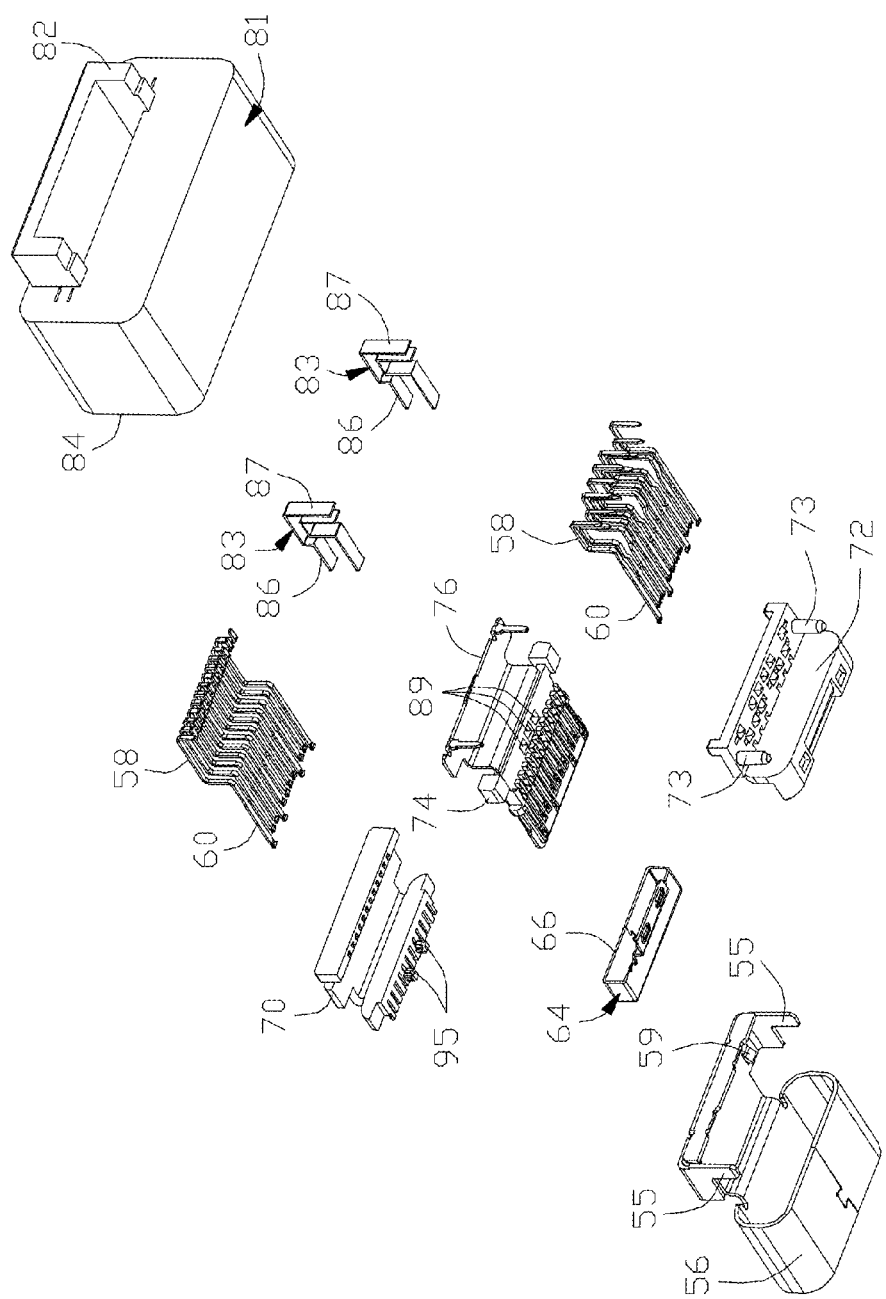
FIG. 7(B) is a rear partially exploded perspective view of the receptacle connector of FIG. 1 to show the parts thereof.
Figure 8A:
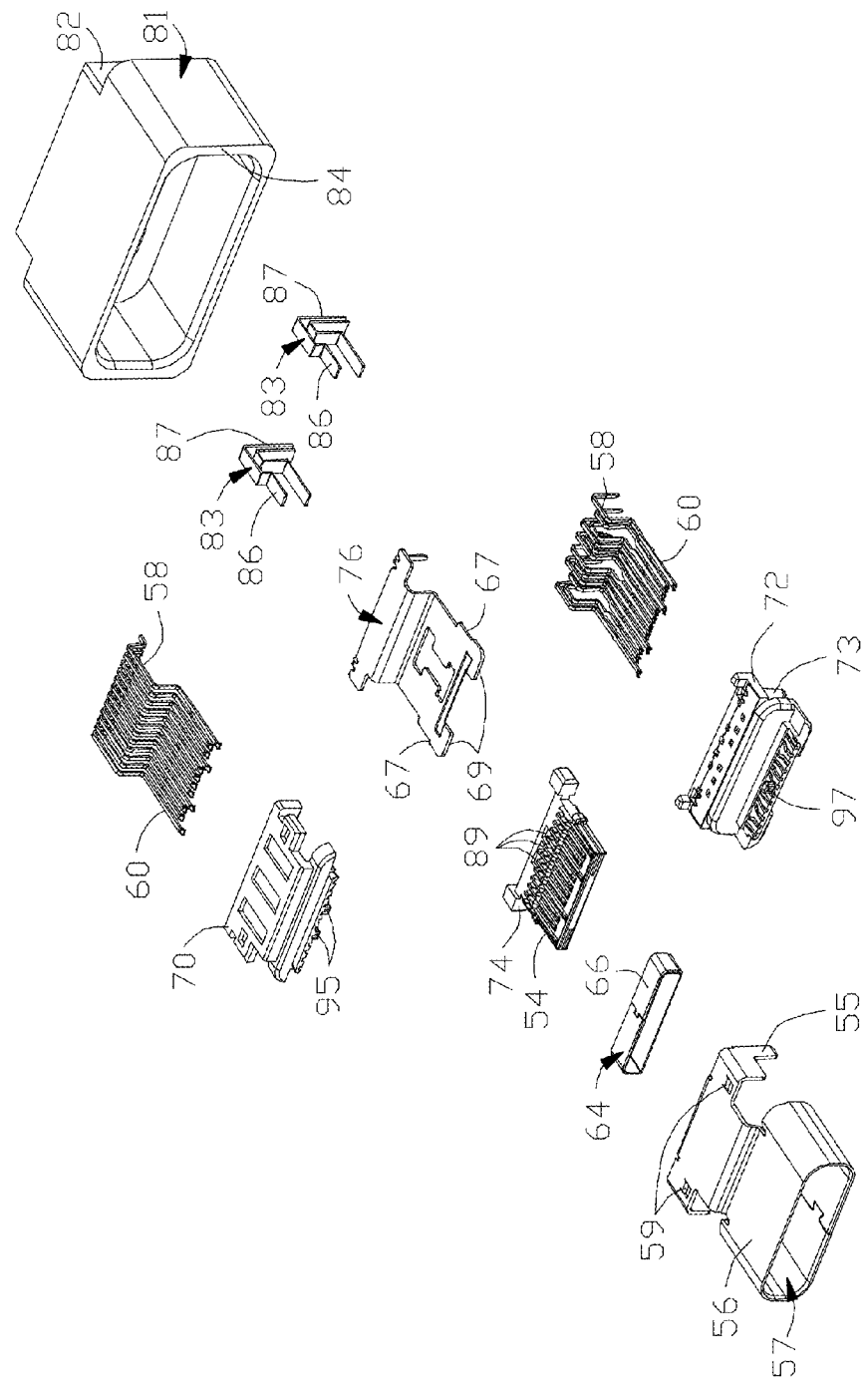
FIG. 8(A) is a front partially exploded perspective view of the receptacle connector of FIG. 7(A) wherein the shielding plate is removed from the middle piece.
Figure 8B:
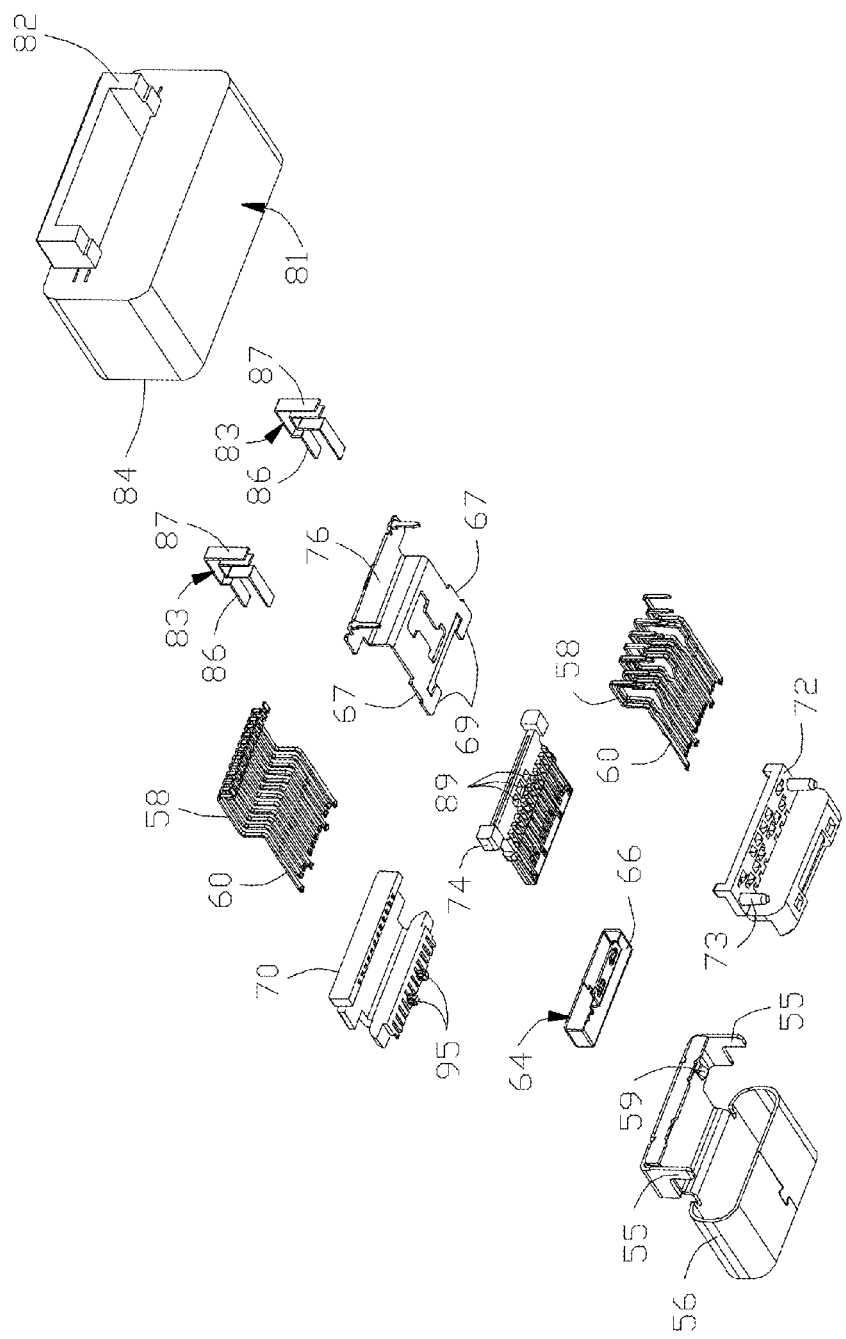
FIG. 8(B) is a rear partially exploded perspective view of the receptacle connector of FIG. 7(B) wherein the shielding plate is removed from the middle piece.
Figure 9:
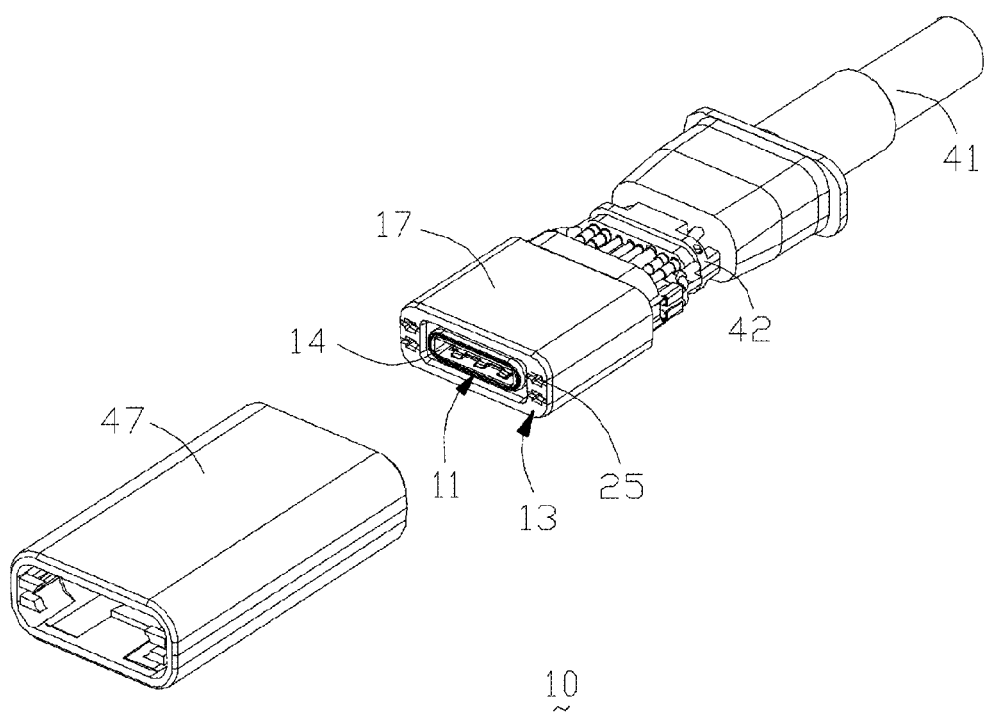
FIG. 9 is a front perspective view of the plug connector of FIG. 1 wherein the cover is removed away from the remainders.
Figure 10:
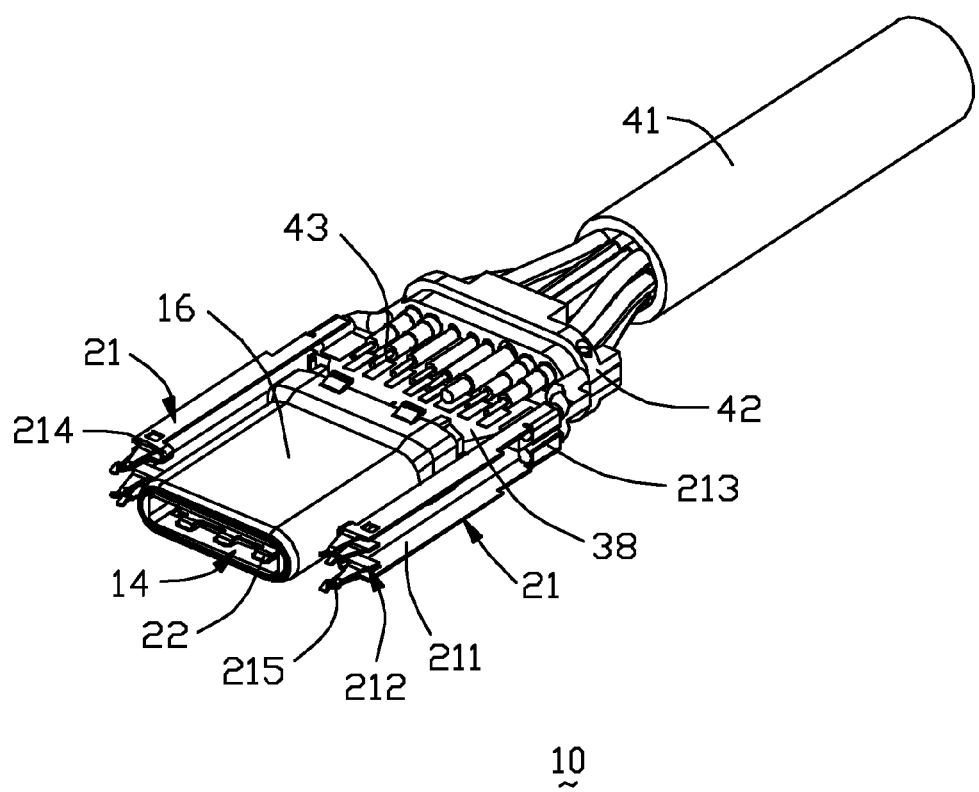
FIG. 10 is a front perspective view of the plug connector of FIG. 9 wherein the outer housing is removed to expose the inner mating port and the larger power contacts.
Figure 11A:
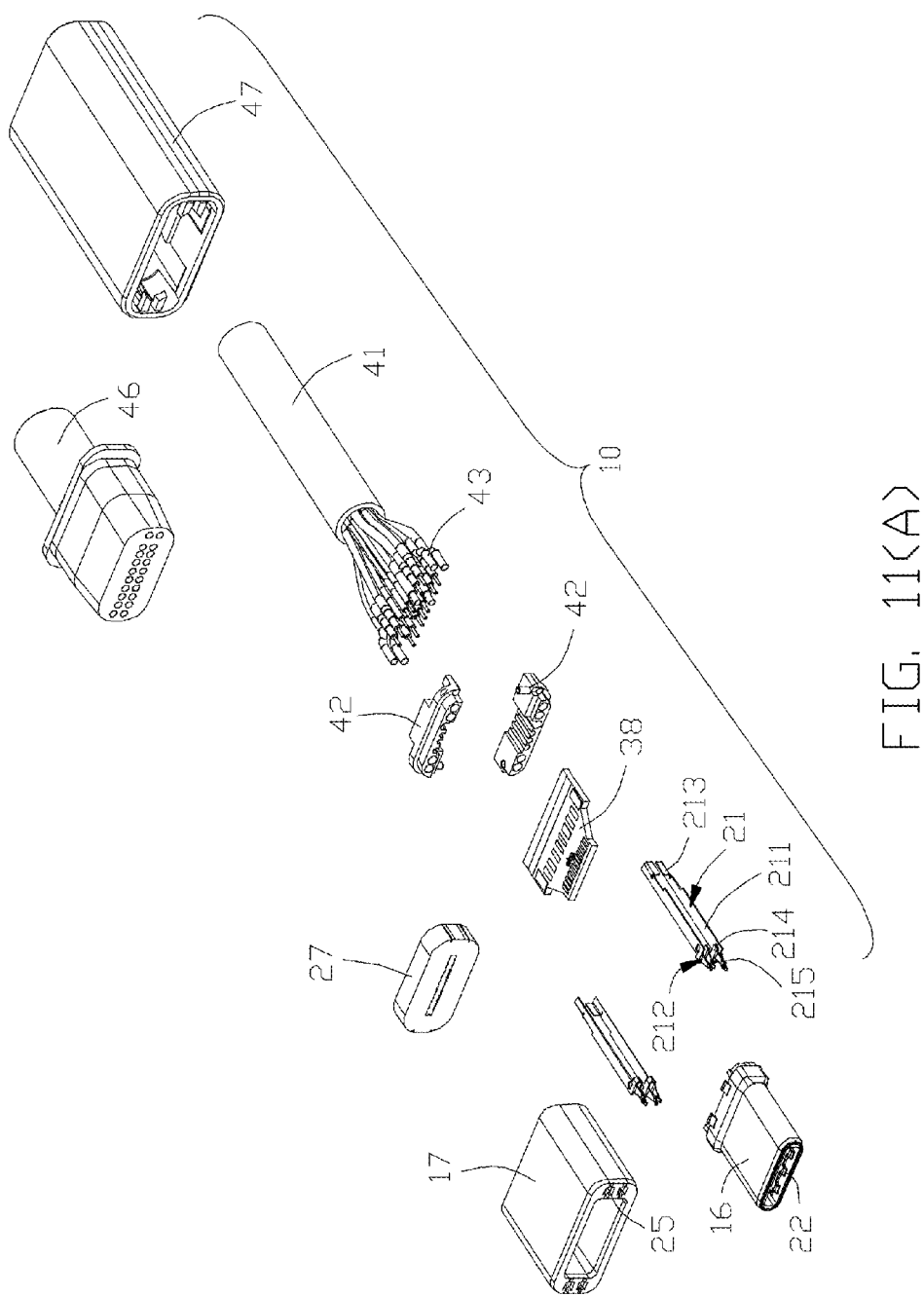
FIG. 11(A) is a front partially exploded perspective view of the plug connector of FIG. 9 to show the internal parts.
Figure 11B:
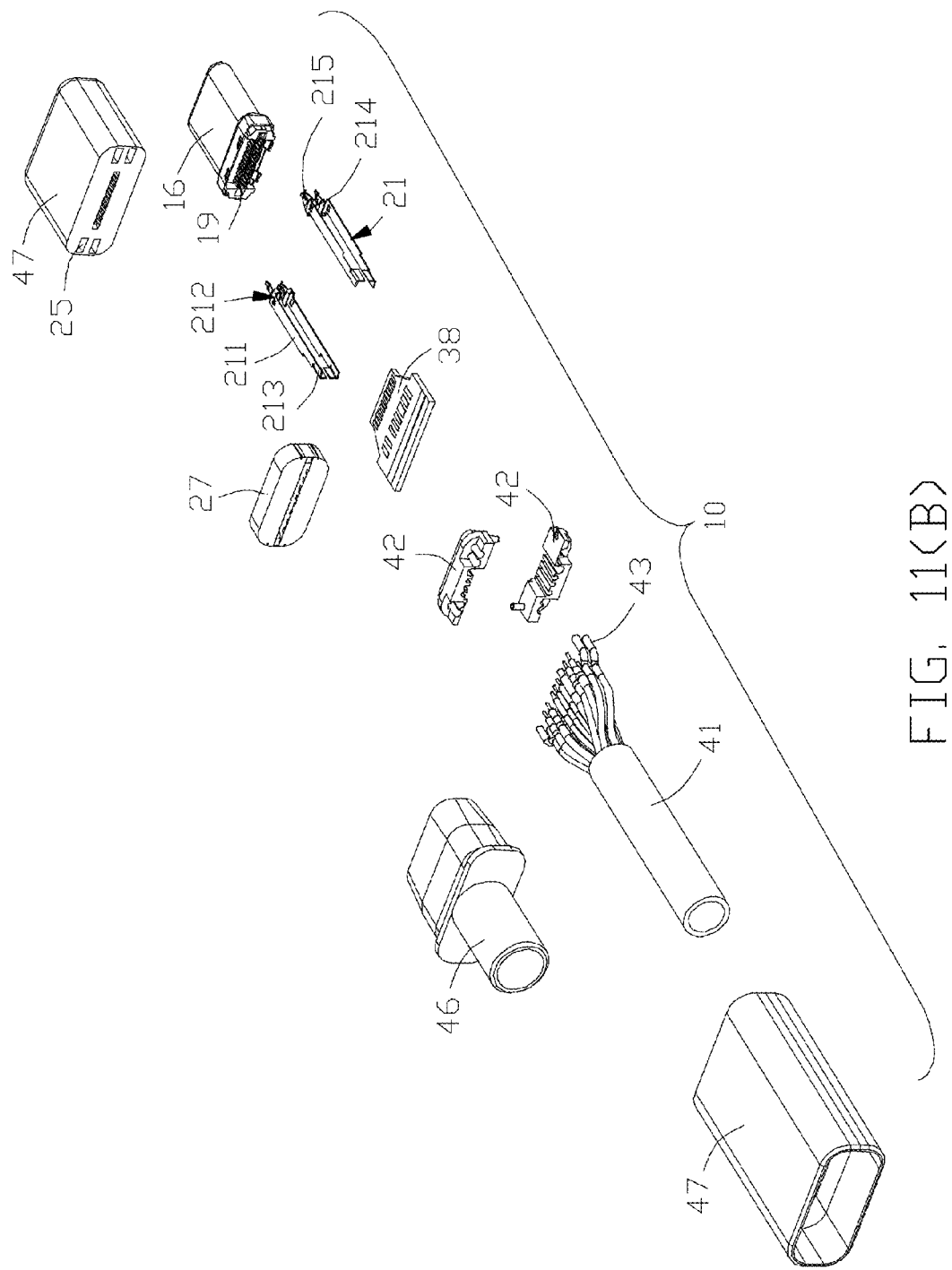
FIG. 11(B) is a rear partially exploded perspective view of the plug connector of FIG. 9 to show the internal parts.
Figure 12:
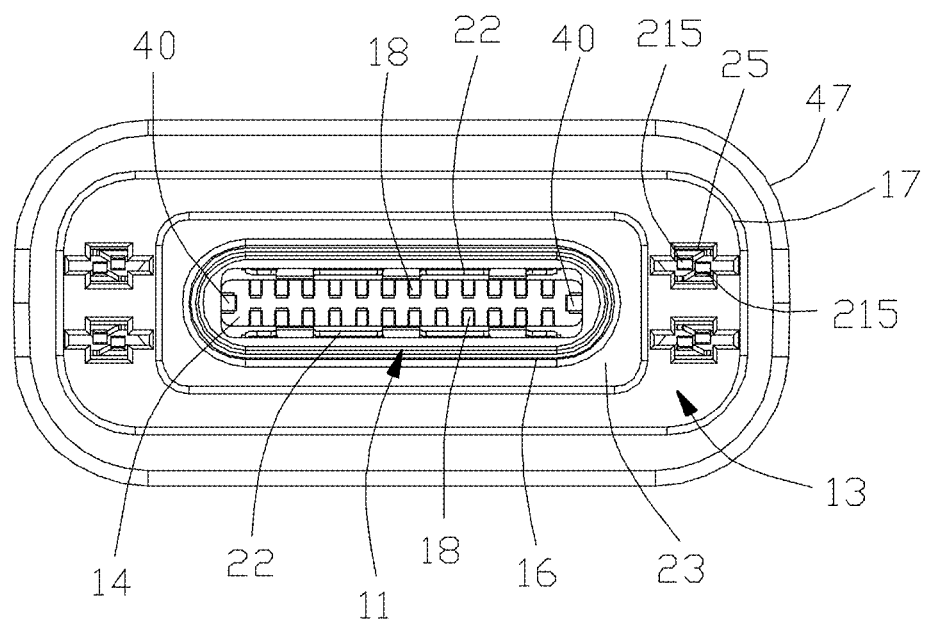
FIG. 12 is a front elevational view of the plug connector of FIG. 1.
Figure 13:
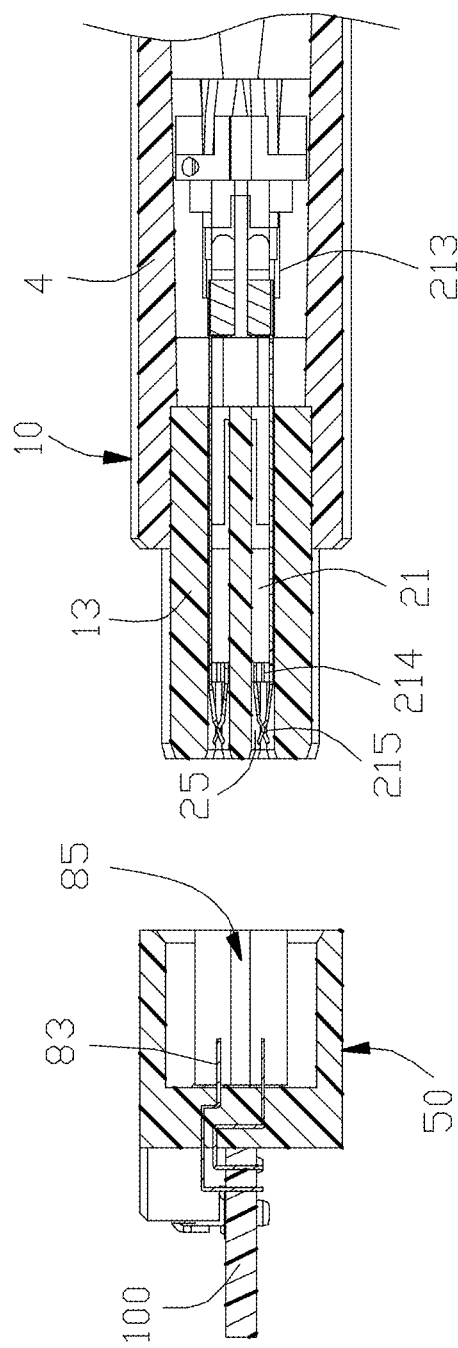
FIG. 13 is a cross-sectional view of the unmated receptacle connector and plug connector of FIG. 1 to show how the larger power contacts of the receptacle connector and those of the plug connector are ready to be mated with each other.

FIGS. 1-2(B) show a plug connector 10 mated with a receptacle connector 50 mounted in a notch 102 of a printed circuit board. 100. Further referring to FIGS. 3-8(B), the receptacle connector 50 includes an inner mating portion 51 circumferentially surrounded by the outer mating portion 53. The inner mating portion 51 is formed by an insulative (inner) housing 52 with a base 521 and a mating tongue 54 forwardly extending from the base 521 in a capsular/inner mating cavity 57 of a metallic shield 56 which encloses the housing 52. Opposite upper and lower rows of contacts 58 are disposed in the housing 52 with corresponding contacting sections 60 exposed upon opposite surfaces of the mating tongue 54 in a diagonally symmetrical arrangement so as to allow a so-called flappable insertion of the plug connector 10 thereinto. The contacts 58 include the signal contacts, the power contacts and the grounding contacts. A step structure 62 is formed around a root of the mating tongue 54. A one piece metallic EMI collar 64 includes a loop structure 66 intimately surrounding the step structure 62.

The housing 52 is composed of the upper piece 70 and a lower piece 72 commonly sandwiching therebetween a middle piece 74 which forms the mating tongue 54. The upper row contacts 58 are associated with the upper piece 70, the lower row contacts 58 are associated with a lower piece 72 and the shielding plate 76 is associated with the middle piece 74 via an insert molding process wherein the contacting sections 60 of the upper row contacts 58 and those of the lower row contacts 58 are seated upon opposite upper surface and lower surface of the mating tongue 54, respectively, as mentioned before. The lower piece 72 includes a pair of mounting posts 73 for mounting to the printed circuit board 100. Same as what is disclosed in the related application No. 61/949,232 filed Mar. 6, 2014, the upper piece 70 further includes a pair of downward assembling poles 95 with ribs thereof interferingly received in the corresponding alignment holes 89 of the middle piece 74, and the lower piece 72 further includes an upward assembling pole 97 with ribs thereof interferingly received in the corresponding alignment holes 89 of the middle piece 74. Via these arrangements, the upper piece 70 and the lower piece 74 can efficiently secure the middle piece 72 therebetween in a vertical direction.

Notably, the shielding plate 76 forms a front edge section 69 extending forwardly beyond a front edge of the mating tongue 54 for anti-mis-mating consideration, and a pair of lateral edge sections 67 for locking with a latch of the standard USB plug connector as disclosed in the related applications. In brief, the shielding plate 76 is essentially multifunctional to perform shielding, grounding, reinforcing, anti-mis-mating and locking. An additional metallic bracket (not shown) may be provided under the shield 56 and hooked to the printed circuit board 100 to support the whole connector 50 in the notch 102. The shield 56 further includes a pair of mounting legs 55 for mounting to the printed circuit board 100 and a pair of locking tabs 59 received in the recesses 99 of the upper piece 70 after the shield 56 is rearwardly assembled to the housing 52 in a front-to-back direction.

Different from the standard USB receptacle connector as disclosed in the related applications, the receptacle connector 50 of the instant invention further includes the outer mating portion 53 surrounding the inner mating portion 51 and essentially composed of an insulative (outer) housing 81 having a rear part 82 in which the four larger power contacts 83 (83$a$1, 83$a$2, 83$b$1, 83$b$2), i.e., two V-Bus and two power return blade type contacts, are retained, and a front part 84 surrounds the shield 56 in a spaced relation to form a loop type/outer mating cavity 85, wherein each of the larger power contacts 83 includes a front contacting section 86 exposed in the loop type mating cavity 85 and a rear tail section 87 for mounting to the printed circuit board 100. Understandably, the front part 84 may be replaced with the metallic piece, if necessary. The four larger power contacts 83$a$1, 83$a$2, 83$b$1, 83$b$2 are disposed in the outer mating cavity 85 and are symmetrically arranged with regard to a center of the inner mating port. That is, the larger power contact 83$a$1 and 83$a$2 are diagonally symmetrical, the larger power contacts 83$b$1, 83$b$2 are diagonally symmetrical. The four larger power contacts 83 are symmetrically located by two sides of the inner mating portion so as to cooperate with the diagonally symmetrically arranged contacts in the inner mating portion to have the whole receptacle connector allow the plug to be inserted therein in a flappable manner.

Referring to FIGS. 9-14 and 16, the plug connector 10 includes an inner mating port 11 surrounded by an outer mating port 13. The inner mating port 11 includes an insulative inner housing 12 with a rectangular receiving cavity 14 therein and enclosed in a metallic shell 16. Opposite upper and lower rows of contacts 18 are disposed in the housing 12 with corresponding contacting sections extending into the receiving cavity 14 wherein the upper and lower rows of contacts 18 are diagonally arranged with each other so as to allow the so-called flappable insertion of the plug connector 10 into the receptacle connector 50. A pair of upper and lower EMI (Electro-Magnetic Interference) spring plates 22 are enclosed in the shell 16, and each of the EMI spring plates 22 is sandwiched between the shell 16 and the housing 12 and includes a front resilient region extending inwardly toward the receiving cavity 14 and in front of the contacting sections, a rear abutting region to abut against the shell 16, and a pair of side retention regions retainably engaged within corresponding side portions of the housing 12. A paddle card 38 is located behind the housing 12 and the contact tails 19 are soldered upon a front region of the paddle card 38. The U-shaped blanking type metallic latch 39, which is similar to what is disclosed in the related application No. 61/949,232 filed Mar. 6, 2014, is optionally provided and received in the side slots 13 of the housing 12 with a pair of locking heads 40 extending into the two opposite lateral sides of the receiving cavity 14 to lock with the lateral edge sections 67 of the shielding plate 76 of the receptacle connector 50 during mating.

A cable 41 behind the paddle card 38, encloses a plurality of wires 43 regulated by a pair of organizers 42 to be soldered upon a rear region of the paddle card 38. A rear overcoat 46 are overmolded upon the wires 43. Different from the standard USB plug connector disclosed in the related applications, the plug connector 10 of the instant invention is further equipped with the outer port 13 which includes an insulative outer housing 17 defining four passageways 25 with therein corresponding larger power contacts 21, i.e., two V-Bus and two power return female type contacts. The larger power contacts 21 are larger than the contacts 58 in the inner mating portion in width along a transverse direction. Each larger power contact 21 includes a main body 211 with a front contacting section 212 for mating with the blade type larger power contact 83 of the receptacle connector 50 during mating and a rear connecting section 213 mechanically and electrically connected to the corresponding wire 43 wherein the front contacting section 212 includes a U-shaped base 214 with a pair of opposite contacting arms 215 offset from while partially overlapped with each other in the deflection direction so as to be adapted to sandwich the blade type larger power contact 83. Notable, a ring like space 23 is formed between the outer mating port 13 and the inner mating port 11 for receiving the shield 56 therein during mating. Finally, a cover 47 essentially fully covers the insulative outer housing 17, the spacer 27, the paddle card 38, the wires 43 and the rear overcoat 46.

During mating, the inner mating port 11 of the plug connector 10 is received within the mating cavity 57 of the inner mating portion 51 of the receptacle connector 50 wherein the mating tongue 54 is received in the receiving cavity 14 with the corresponding contacting sections 60 of the contacts 58 of the receptacle connector 50 connected to the contacting sections of the contacts 18 of the plug connector 10; the outer mating port 13 of the plug connector 10 is received in the loop like mating cavity 85 wherein the contacting section 215 of the larger power contact 21 of the plug connector 10 clips the contacting section 86 of the larger power contact 83 of the receptacle connector 50. On the other hand, the latch 39 is locked with the shielding plate 76, and the spring plate 22 contacts the collar 64. One important feature of the invention is to provide the docking type connector with the additional larger power supply in addition to the standard USB mating interface. Thus, such a docking type receptacle connector may selectively receive the corresponding powered plug/cable connector 10 as disclosed in the invention or the standard USB plug connector as disclosed in the related applications.

Figure 14:
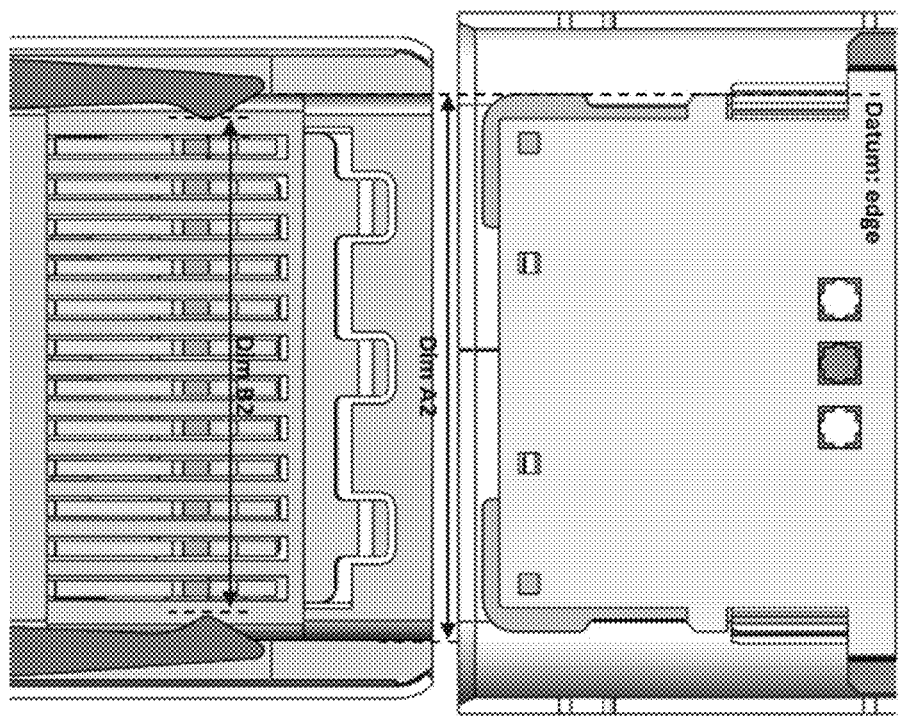
FIG. 14 shows an embodiment of the plug connector lacking the latch in comparison with the standard plug connector.
Figure 15:
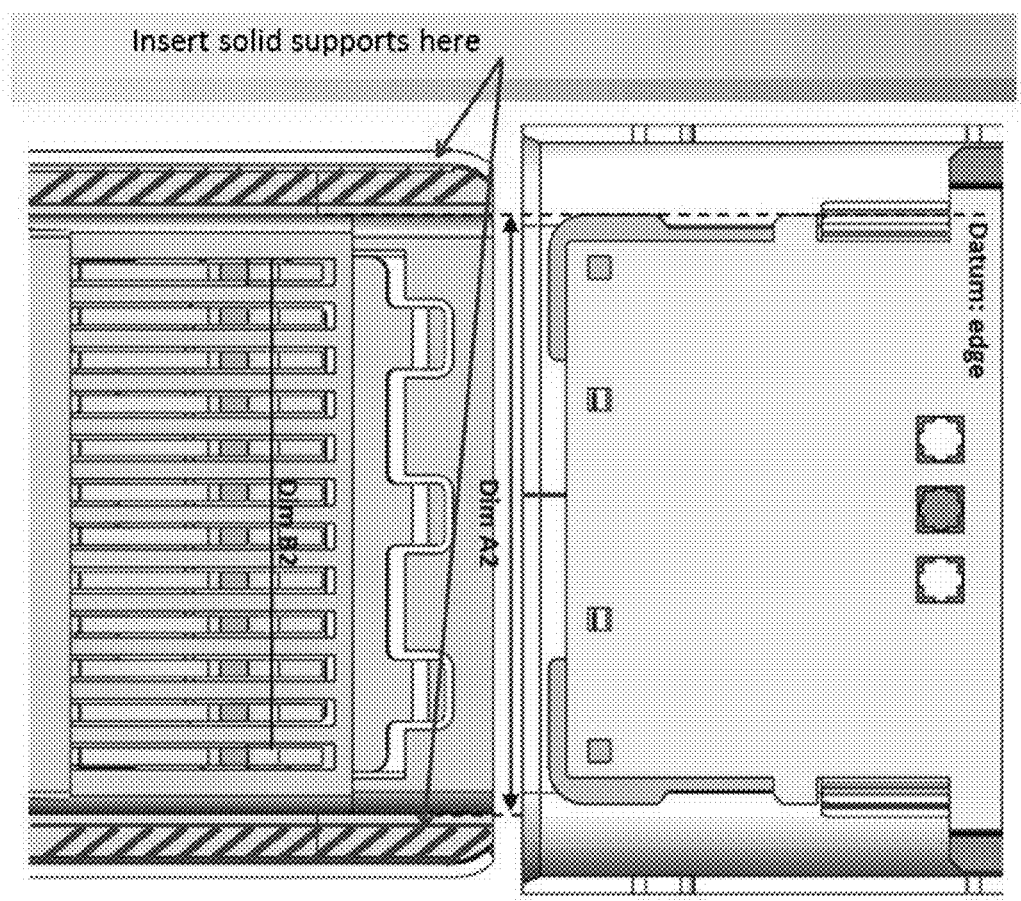
FIG. 15 shows an embodiment of the plug connector having the latch similar to the standard plug connector.
Figure 16:
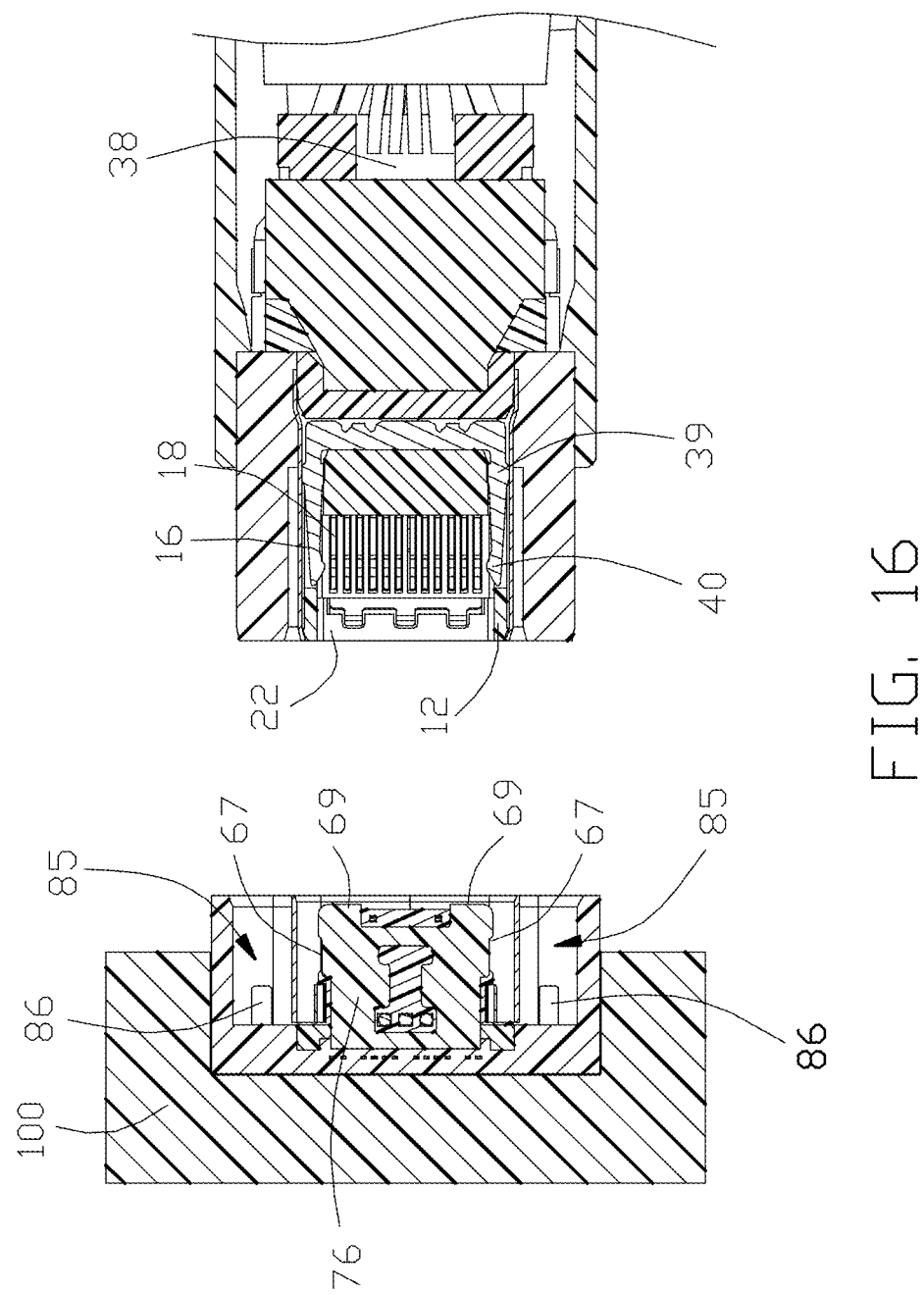
FIG. 16 is a cross-sectional view of the unmated receptacle connector and the plug connector of FIG. 1 to show the embodiment of the plug connector equipped with the latch and the additional larger power contacts.

FIG. 14 shows the embodiment of the plug connector without the latch while FIG. 15 shows the embodiment of the plug connector having the latch thereof.

Figure 17:
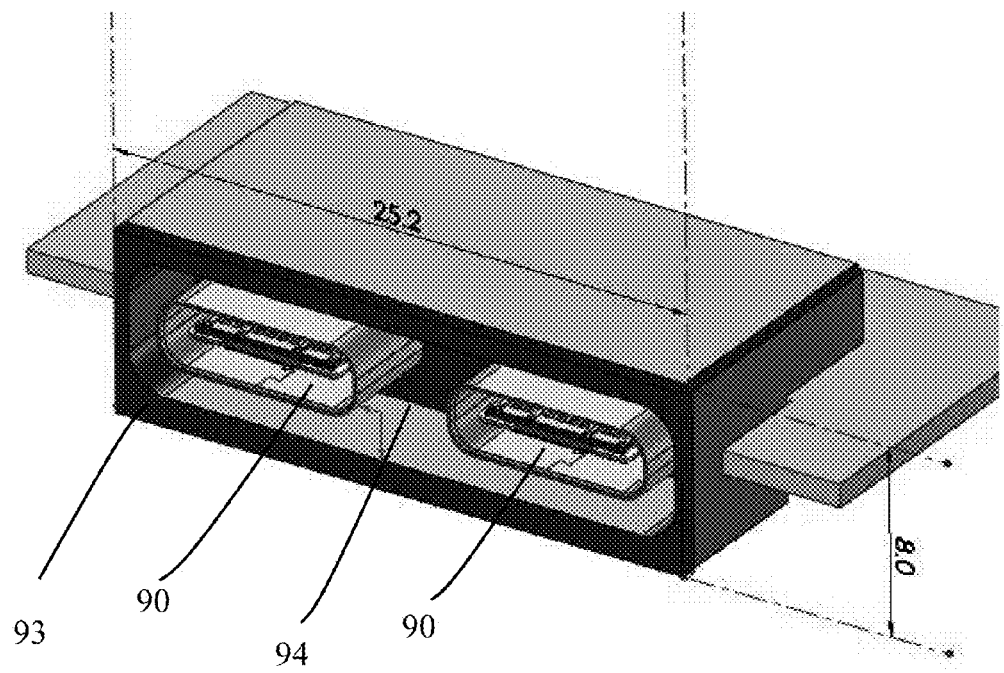
FIG. 17 shows the docked receptacle connectors according to another embodiment of the invention.
Figure 18:
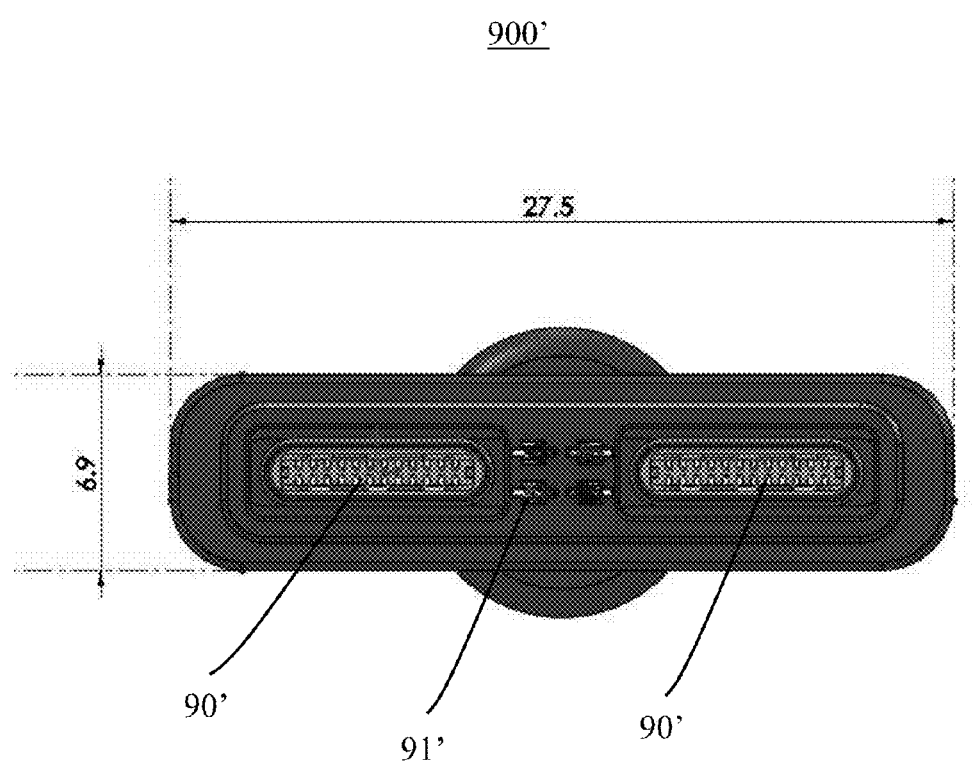
FIG. 18 shows a docked plug connectors for mating with the docked receptacle connector of FIG. 17.

FIG. 17 shows a dual-port embodiment of the docked arrangement 900 equipped with the additional larger power contacts wherein the two inner mating ports 90 are side by side arranged with each other with the additional larger power contacts (not shown) therebetween. The two inner mating ports 90 are surrounded with an out insulative housing 93 to define an outer mating port 94. Understandably, the larger power contacts located between these two mating ports 90 are symmetrically arranged with regard to an imaginary vertical center line so as to allow a corresponding dual port plug connector 900' with tow inner mating ports 91' to be coupled thereto in a flippable manner, i.e., two orientations. Notably, such a dual-port arrangement may be converted from the transverse direction to the vertical direction as long as the additional larger power contacts are arranged symmetrically with regard to the imaginary horizontal center line. Understandably, the dual-port receptacle connector 900 as shown in FIG. 17 is also adapted to be coupled with the single port powered plug connector 10, or the single port standard USB plug connector as shown in FIG. 23(C) or the dual-port standard USB plug connector. The key issue is to have the power contacts arrangement between two mating ports is configured to be in a mirror image manner not only with regard to the middle center line therebetween but also in a diagonal direction.

Figure 19:
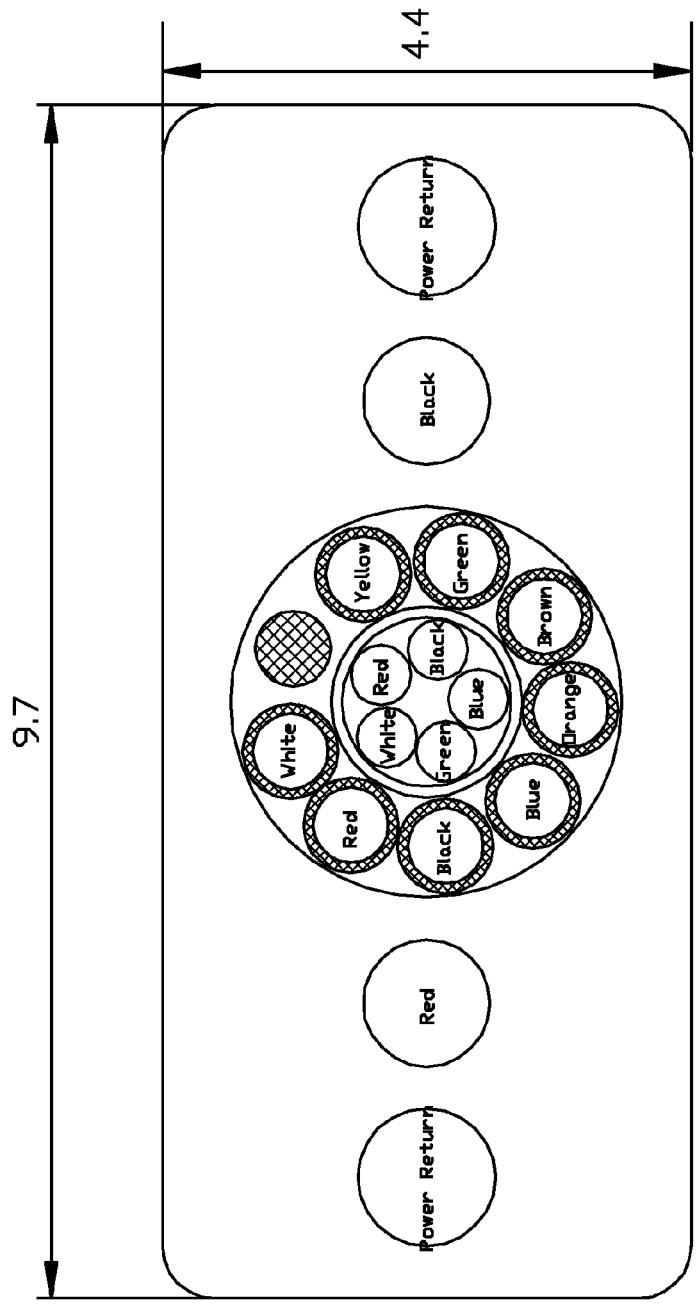
FIG. 19 shows a cross-sectional view of a raw cable according to the invention.

FIG. 19 shows the cross-sectional view of the raw cable for use with the plug connector 10 of the invention.

However, the disclosure is illustrative only, changes may be made in detail, especially in matter of shape, size, and arrangement of parts within the principles of the invention.

What is claimed is:

1. A receptacle connector for use with a plug, comprising:
an inner mating portion surrounded by an outer mating portion in a concentric manner,
said inner mating portion including:
an insulative inner housing having a base with a mating tongue forwardly extending therefrom;
a plurality of contacts disposed in the housing with contacting sections exposed upon the mating tongue;
a metallic shell enclosing the housing to define a capsular mating cavity in which said mating tongue is disposed;
the outer mating portion including:
an insulative outer housing surrounding the metallic shell with an outer mating cavity radially therebetween; and
a plurality of larger power contacts which are larger than the contacts in width, disposed in the outer mating cavity and symmetrically arranged with regard to a center of the inner mating port.

2. The receptacle connector as claimed in claim 1, wherein the larger power contacts are retained by the insulative outer housing.

3. The receptacle connector as claimed in claim 1, wherein the contacts of the inner mating portion are arranged in two rows and are diagonally arranged with each other; the outer mating portion has four larger power contacts which are symmetrically located by two sides of the inner mating portion so as to cooperate with the diagonally symmetrically arranged contacts in the inner mating portion to have the whole receptacle connector allow the plug to be inserted therein in a flappable manner.

4. The receptacle connector as claimed in claim 3, wherein the larger power contacts are symmetrically located by two sides of the inner mating portion in a transverse direction of the receptacle connector.

5. A plug connector for use with a complementary receptacle connector, comprising:
an inner mating port and an outer mating port surrounding said inner mating port in a concentric manner,
said inner mating port including:
an insulative inner housing defining a receiving cavity and enclosed in a metallic shell;
a plurality of contacts disposed in the inner housing and by two sides of the receiving cavity in a vertical direction;
said outer mating port including:
an insulative outer housing surrounding the metallic shield with a space therebetween radially;
a plurality of larger power contacts which are larger than the contacts in the inner matting port in width, disposed in corresponding passageways formed in the insulative outer housing, and symmetrically arranged with regard to a center of the inner mating port.

6. The plug connector as claimed in claim 5, wherein the contacts in the inner mating port are diagonally symmetrically arranged with each other, the larger power contacts are symmetrically located by two sides of the inner mating port so as to cooperate with the diagonally symmetrically arranged contacts in the inner mating port to allow the plug to be inserted into the complementary receptacle connector in a flappable manner.

7. The plug connector as claimed in claim 5, wherein the larger power contacts are symmetrically located by two sides of the inner mating port in a transverse direction of the plug connector.

8. A dual-port receptacle connector comprising:
a pair of opposite mating ports, each of said mating ports defining a mating cavity with a mating tongue therein, each mating tongue being equipped with a plurality of contacts diagonally symmetrically arranged on two surfaces of the mating tongue so as to allow a single port plug connector to be coupled thereto in a flippable manner; and
a plurality of larger power contacts which are larger than the contacts in width, being disposed between the pair of mating ports and symmetrically with regard to an imaginary center line so as to alternately allow a dual port plug connector to be coupled to said opposite mating ports in the flippable manner.

9. The dual port receptacle connector as claimed in claim 8, wherein said pair of opposite mating ports are arranged in a transverse direction and said imaginary center line extends vertically.

\* \* \* \* \*